United States Patent
Agarwal et al.

(10) Patent No.: US 10,431,489 B2
(45) Date of Patent: Oct. 1, 2019

(54) SUBSTRATE SUPPORT APPARATUS HAVING REDUCED SUBSTRATE PARTICLE GENERATION

(71) Applicant: APPLIED MATERIALS, INC., Santa Clara, CA (US)

(72) Inventors: Pulkit Agarwal, Santa Clara, CA (US); Song-Moon Suh, San Jose, CA (US); Glen Mori, Gilroy, CA (US); Steven V. Sansoni, Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 542 days.

(21) Appl. No.: 14/554,945

(22) Filed: Nov. 26, 2014

(65) Prior Publication Data

US 2015/0170954 A1     Jun. 18, 2015

Related U.S. Application Data

(60) Provisional application No. 61/917,324, filed on Dec. 17, 2013.

(51) Int. Cl.
| | | |
|---|---|---|
| *H01L 21/687* | (2006.01) | |
| *B25J 15/00* | (2006.01) | |
| *B25J 11/00* | (2006.01) | |

(52) U.S. Cl.
CPC ..... *H01L 21/68757* (2013.01); *B25J 11/0095* (2013.01); *B25J 15/0014* (2013.01); *H01L 21/6875* (2013.01); *H01L 21/68707* (2013.01)

(58) Field of Classification Search
CPC ........... H01L 21/68757; H01L 21/6875; H01L 21/68707; B25J 11/0095; B25J 15/0014
See application file for complete search history.

(56) References Cited

U.S. PATENT DOCUMENTS

| | | |
|---|---|---|
| 8,858,715 B2 | 10/2014 | Van Munster et al. |
| 2004/0241992 A1 | 12/2004 | Kono et al. |
| 2005/0252454 A1 | 11/2005 | Parkhe et al. |

(Continued)

FOREIGN PATENT DOCUMENTS

| | | |
|---|---|---|
| EP | 1 063 683 A2 | 12/2000 |
| JP | 04-000736 | 6/1992 |

(Continued)

OTHER PUBLICATIONS

SiliconeProperties.pdf from www.memsnet.org/material/siliconsibulk/ printed Oct. 12, 2016, 5 pages.*

(Continued)

*Primary Examiner* — Michael S Lowe
(74) *Attorney, Agent, or Firm* — Moser Taboada; Alan Taboada

(57) ABSTRACT

Embodiments of apparatus for supporting a substrate are disclosed herein. In some embodiments, an apparatus for supporting a substrate includes: a support surface; and a plurality of substrate contact elements protruding from the support surface, wherein the plurality of substrate contact elements are formed of a material having a hardness less than or equal to a hardness of silicon, having a low adhesion, having a coefficient of static friction large enough to prevent sliding, having a surface roughness less than or equal to 10 Ra, and that is electrically conductive.

20 Claims, 3 Drawing Sheets

(56) References Cited

U.S. PATENT DOCUMENTS

| | | |
|---|---|---|
| 2008/0062612 A1 | 3/2008 | Morioka et al. |
| 2008/0105201 A1 | 5/2008 | Ronan et al. |
| 2010/0178137 A1 | 7/2010 | Chintalapati et al. |

FOREIGN PATENT DOCUMENTS

| | | | | |
|---|---|---|---|---|
| JP | 05-029431 A | | 2/1993 | |
| JP | 2001-326271 A | | 11/2001 | |
| JP | 2003-037156 A | | 2/2003 | |
| JP | 2004266202 A | * | 9/2004 | ............ H01I 21/68 |
| JP | 2006-156616 A | | 6/2006 | |
| KR | 10-2006-0023735 A | | 3/2006 | |

OTHER PUBLICATIONS

International Search Report and Written Opinion dated Mar. 18, 2015 for PCT Application No. PCT/US2014/069031.
Supplementary European Search Report dated Jan. 27, 2017 received for EP Application No. EP 14 87 1014.

\* cited by examiner

SUBSTRATE SUPPORT APPARATUS HAVING REDUCED SUBSTRATE PARTICLE GENERATION

FIELD

Embodiments of the present disclosure generally relate to semiconductor processing equipment.

BACKGROUND

In the fabrication of microelectronic devices on semiconductor substrates, the semiconductor substrate is handled on the edge and backside numerous times during the manufacturing process. Such handling can cause contaminants to adhere to the backside of the substrate and travel between processing components, for example, from chamber to chamber, FOUP (front opening unified pod) to FOUP, or process tool to process tool along with the substrate, or between different substrates, thus increasing tool downtime for maintenance to remove the contaminants. These contaminants can also migrate to the front side of the substrate, resulting in reduced device performance and/or yield loss.

Typical solutions to this problem have been to reduce the backside particle generation by reducing a contact area between the substrate and substrate transferring/handling devices. However, while this solution mitigates particle generation, the inventors have observed that large numbers of particles are still generated even with the smallest contact areas contemplated.

As such, the inventors have provided embodiments of improved apparatus for supporting and handling a substrate with reduced particle generation.

SUMMARY

Embodiments of apparatus for supporting a substrate are disclosed herein. In some embodiments, an apparatus for supporting a substrate includes: a support surface; and a plurality of substrate contact elements protruding from the support surface, wherein the plurality of substrate contact elements are formed of a material having a hardness less than or equal to a hardness of silicon, having a low adhesion, having a coefficient of static friction large enough to prevent sliding, having a surface roughness less than or equal to 10 Ra, and that is electrically conductive.

In some embodiments, an apparatus for supporting a substrate includes: a support surface; and a plurality of substrate contact elements protruding from the support surface and arranged to support a substrate, wherein the plurality of substrate contact elements are formed of a material having a hardness less than or equal to a hardness of silicon, a coefficient of static friction large enough to prevent sliding, and a surface roughness less than or equal to 10 Ra, wherein the plurality of substrate contact elements are electrically conductive, and wherein the material comprises one or more of an electrically conductive plastic, aluminum oxide, silicon nitride, or stainless steel.

In some embodiments, a substrate processing system includes: a substrate support disposed in a processing chamber, the substrate support having a substrate support surface and a plurality of lift pins arranged to support a substrate above the substrate support surface when lifted with respect to the substrate support; and a substrate transfer robot including a support surface and a plurality of contact elements arranged to support the substrate when disposed on the substrate transfer robot, wherein at least one of the substrate support surface, the plurality of contact elements, or the plurality of lift pins are formed of a material having a hardness less than or equal to a silicon hardness, having low adhesion, having a coefficient of static friction large enough to prevent sliding, having a surface roughness less than or equal to 10 Ra, and that is electrically conductive.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the present disclosure depicted in the appended drawings. It is to be noted, however, that the appended drawings illustrate only typical embodiments of this present disclosure and are therefore not to be considered limiting of scope, for the present disclosure may admit to other equally effective embodiments.

Figure 1:
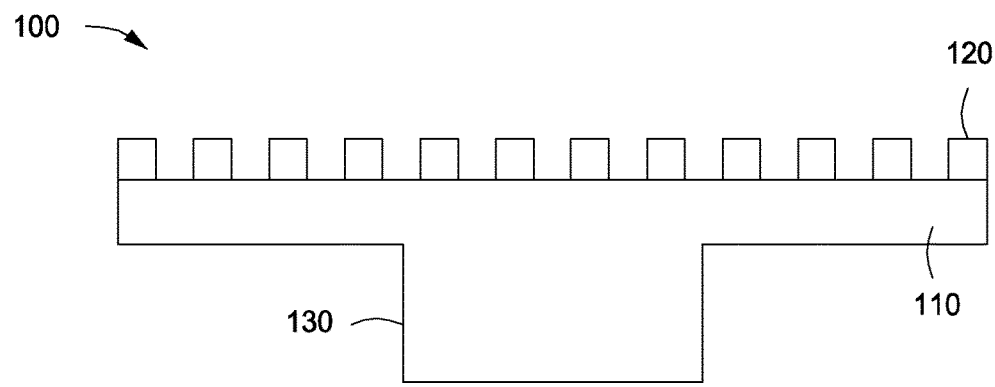
FIG. 1 depicts a schematic side view of a substrate support in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide improved substrate supporting and handling apparatus that provides reduced particle generation as compared to conventional substrate supporting apparatus. Embodiments of the present disclosure may advantageously avoid or reduce contamination accumulated on a substrate during the manufacturing process, such as while handling the substrate between process steps and/or while supporting the substrate inside a process chamber, which can further limit or prevent contaminants from reaching the front-side of a substrate and causing device performance issues and/or yield loss. Embodiments of the present disclosure may be used in a wide variety of surfaces that contact a substrate in a process that utilizes very low addition of particles, for example, in display processing, silicon wafer processing, and optics manufacturing.

FIG. 1 depicts a substrate support 100 on which a substrate to be processed is placed according to some embodiments of the present disclosure. The substrate support 100 may include any type of support, such as, for example, a pedestal, a vacuum chuck, or the like. The substrate support 100 may include a support base 110, a plurality of contact elements 120, and a support shaft 130. The substrate support 100 is typically disposed within a processing chamber (not shown) and a substrate (not shown) is placed on the substrate support for processing. During the processing, the backside of the substrate is supported by the contact elements 120. The substrate support 100 may include additional elements commonly found in substrate supports for microelectronic device fabrication, such as non-limiting examples of heating and/or cooling elements, RF and/or DC electrodes, backside gas provisioning, or the like. These additional elements are not shown for simplicity of description.

Figure 2:
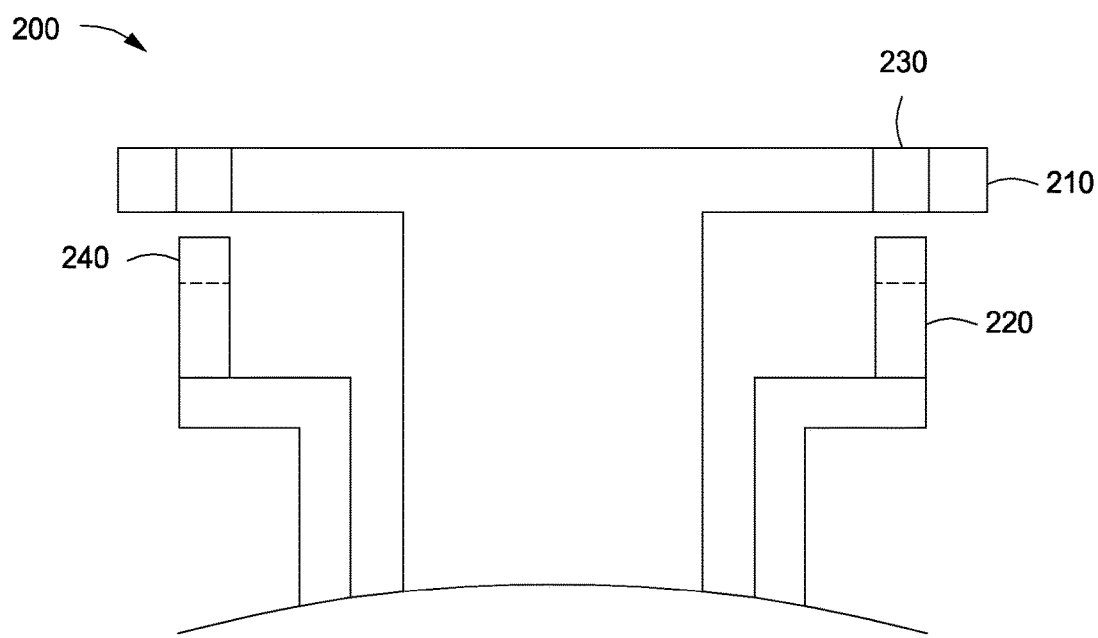
FIG. 2 depicts a schematic side view of a substrate support in accordance with some embodiments of the present disclosure.

FIG. 2 depicts a substrate support 200 according to some embodiments of the present disclosure. The substrate support 200 is substantially similar to the substrate support 100, except that the substrate support 200 includes a plurality of through holes 230 in a support base 210 through which lift pins 220 extend. For example, a substrate (not shown) to be processed is initially placed on the lift pins 220, which extend through the holes 230 beyond the support base 210. After the substrate is placed on the extended lift pins 220, the lift pins 220 are retracted so that the substrate is disposed on the support base 210. As with the substrate support 100, the substrate support 200 may be configured as, for example, a pedestal, a vacuum chuck, an electrostatic chuck, or the like. The substrate support 200 may also include the plurality of contact elements 120 on an upper surface of the support base 210.

Figure 3:
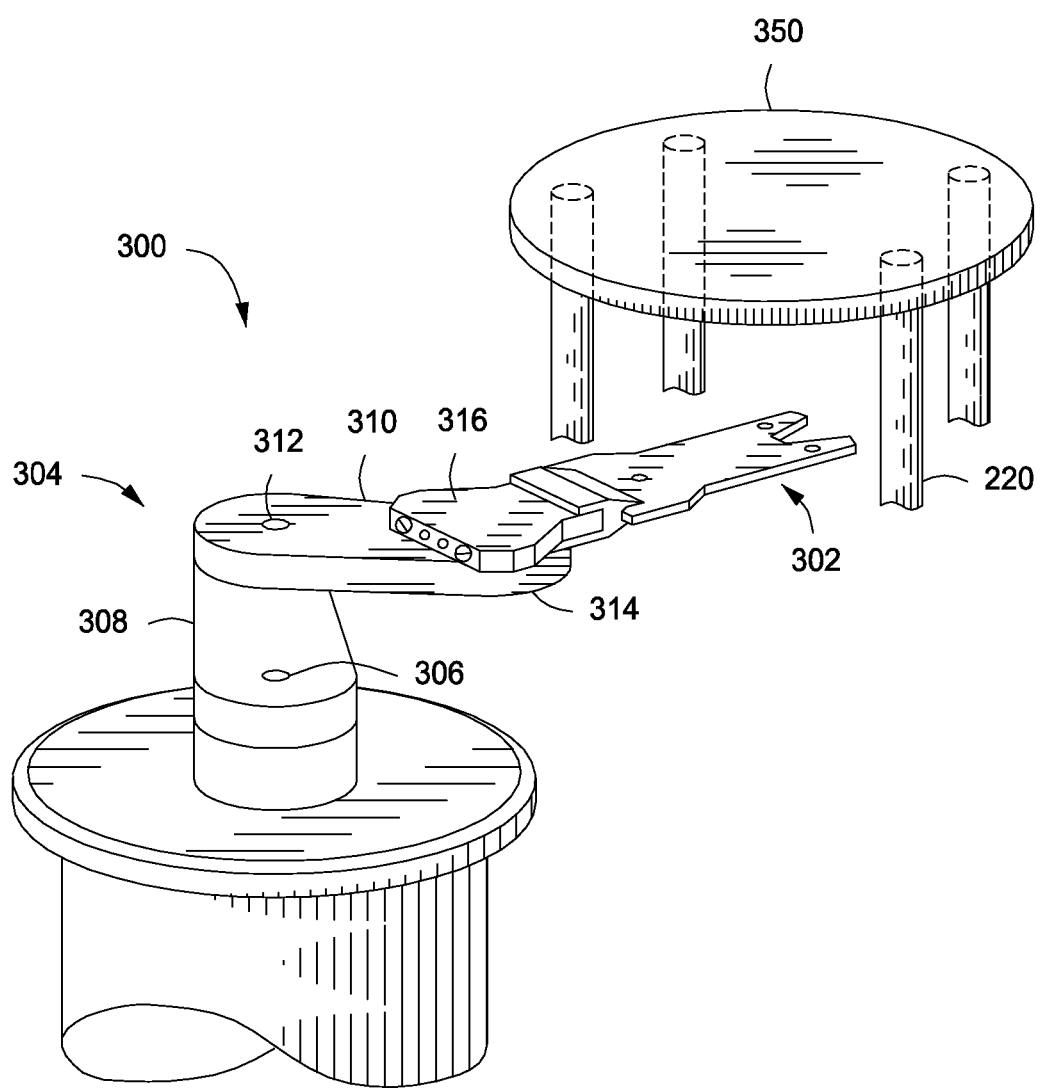
FIG. 3 depicts a substrate transfer robot for transferring a substrate resting on lift pins of a substrate support in accordance with some embodiments of the present disclosure.

FIG. 3 illustrates a substrate transfer robot 300 according to some embodiments of the present disclosure. For example, a substrate transfer robot 300 may comprise a robot arm (arm 304) for vertical and rotational displacement at a first end 306. The arm 304 may comprise one or more links, for example first link 308 and second link 310 pinned together at axis 312. A second end 314 of the arm 304 may include a wrist 316 to which the first end of a blade 302 is coupled. The blade 302 may include contact pads 410, described below with respect to FIG. 4.

Figure 4:
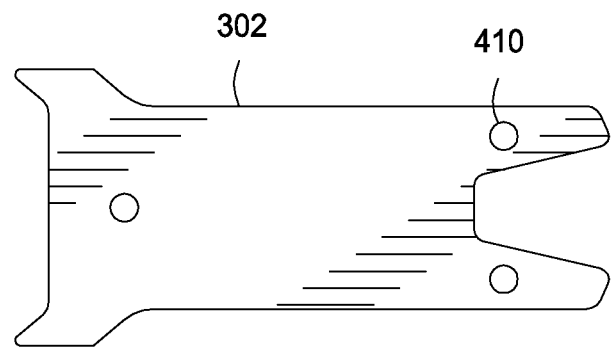
FIG. 4 depicts a plan view of an end effector of a substrate transfer robot in accordance with some embodiments of the present disclosure.

FIG. 4 depicts a top view of the blade 302 showing an illustrative configuration of the contact pads 410 in accordance with some embodiments of the present disclosure. Although three contact pads 410 are depicted in a particular configuration in FIG. 4, other configurations suitable for supporting a substrate, having the same or different numbers of contact pads, may also be used.

Figure 5:
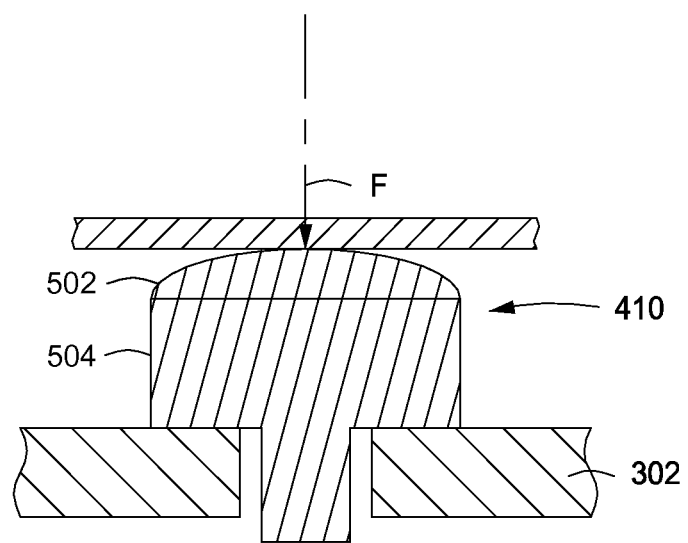
FIG. 5 depicts a sectional view of a portion of a substrate transfer robot blade in accordance with some embodiments of the present disclosure.

In operation, the substrate transfer robot 300 may be operated such that the blade 302 is positioned below a substrate 350 supported on the plurality of lift pins 220. Through mechanical manipulations of the substrate transfer robot 300 and the arm 304, the blade 302 is raised from a position below the substrate 350 to bring the contact pads 410 into contact with the back side of the substrate 350 to transfer the substrate 350 off of the lift pins 220. In doing so, the substrate transfer robot 300, through the arm 304 and the blade 302, accelerates the substrate from a velocity of zero to a transfer speed. The acceleration results in a force F at contact areas corresponding to the locations of the contact pads 410, as illustrated in FIG. 5. As a result, particles are generated at the contact area between the contact pads 410 and the substrate 350. This similarly occurs anywhere at which objects, such as, for example, the lift pins 220 and the contact elements 120 contact the substrate 350.

The inventors have discovered that particles are generated when the material of any element that contacts the substrate is harder than the substrate material (e.g., silicon), has a high adhesion to the substrate material, cannot prevent the substrate from sliding, has a rough surface, and is not conductive. For example, if a substrate is initially contacted by an element formed of a sticky material and is later contacted by another element formed of a hard material, the generation of particles on the substrate is exacerbated. Similarly, if there is current flow between the substrate and a conductive material and the substrate is lifted by a non-conductive material, arcing may occur, thus exacerbating the generation of particles on the substrate.

Therefore, the inventors have discovered that particle generation can be prevented or substantially minimized by using a material exhibiting a predetermined set of properties in elements that contact the substrate. The predetermined set of properties includes: a hardness less than or equal to that of a substrate to be supported (e.g., silicon), non-adhesiveness, a coefficient of static friction high enough to prevent sliding of the substrate on elements that contact the substrate, electrically conductive, and a surface roughness less than or equal to 10 Ra. Such a material may include, for example, aluminum oxide, silicon nitride, stainless steel, and electrically conductive plastics, such as kapton®, kalrez®, vespel®, and celazole®. Other process-compatible materials exhibiting the above-noted properties may be used. In some embodiments, the elements that contact the substrate may be entirely formed of the material. In some embodiments, the elements that contact the substrate may be formed of the material in at least portions of the element that contact the substrate. For example, an upper portion 240 of the lift pins 220 that contacts the substrate may be formed of the material and a lower portion may be formed of another process-compatible material that may or may not exhibit the above-noted properties. In some embodiments, the same material can be used in all of the elements that contact the substrate. Alternatively, different materials, each exhibiting the above-noted properties, may be used in the various elements that contact the substrate.

Referring to FIG. 5, in some embodiments, each contact pad 410 of the substrate transfer robot 300 may entirely be formed of the material. In some embodiments, an upper portion 502 of each contact pad 410 may be formed of the material and a lower portion 504 may be formed of a different material that does not necessarily exhibit the same properties discussed above.

Thus, improved apparatus and materials for avoiding particle generation on a substrate have been disclosed herein. The inventive apparatus may advantageously allow for the reduction or prevention of contamination accumulated on a substrate during the manufacturing process, such as during handling the substrate between process steps and while supporting the substrate inside a process chamber, thus preventing or reducing the incidence of contaminants from reaching the front-side of a substrate and causing reduced device performance and/or yield loss.

While the foregoing is directed to embodiments of the present disclosure, other and further embodiments of the present disclosure may be devised without departing from the basic scope thereof.

The invention claimed is:
1. An apparatus for supporting a substrate, comprising:
a support surface; and
a plurality of substrate contact elements protruding from the support surface, wherein the plurality of substrate contact elements are formed of a non-silicon based material having a hardness less than or equal to a hardness of silicon, having non-adhesiveness with silicon-based materials, having a coefficient of static friction that prevents sliding when contacting silicon-based materials, having a surface roughness less than or equal to 10 Ra, and that is electrically conductive such that particles generated from a substrate when contacting the plurality of substrate contact elements is reduced.

2. The apparatus of claim 1, wherein the support surface is part of a substrate support and the plurality of contact elements protrude from the substrate support.

3. The apparatus of claim 1, wherein the support surface is part of a substrate support and the plurality of contact elements include a plurality of lift pins disposed in the substrate support.

4. The apparatus of claim 3, wherein an upper portion of each of the plurality of lift pins is formed of the non-silicon based material.

5. The apparatus of claim 3, wherein each of the plurality of lift pins is entirely formed of the non-silicon based material.

6. The apparatus of claim 1, wherein the support surface is part of a substrate transfer robot and the plurality of contact elements include contact pads disposed on an end effector of the substrate transfer robot.

7. The apparatus of claim 1, wherein the non-silicon based material is an electrically conductive plastic.

8. The apparatus of claim 1, wherein the non-silicon based material comprises one or more of aluminum oxide or stainless steel.

9. An apparatus for supporting a substrate, comprising:
a support surface; and
a plurality of substrate contact elements protruding from the support surface and arranged to support a substrate, wherein the plurality of substrate contact elements are formed of a non-silicon based material having a hardness less than or equal to a hardness of silicon, a coefficient of static friction that prevents sliding when in contact with silicon-based materials, and a surface roughness less than or equal to 10 Ra, wherein the plurality of substrate contact elements are electrically conductive, and wherein the non-silicon based material comprises one or more of an electrically conductive plastic, aluminum oxide, or stainless steel such that particles generated from a substrate when contacting the plurality of substrate contact elements is reduced.

10. The apparatus of claim 9, wherein the support surface is part of a substrate support and the plurality of contact elements protrude from the substrate support.

11. The apparatus of claim 9, wherein the support surface is part of a substrate support and the plurality of contact elements include a plurality of lift pins disposed in the substrate support.

12. The apparatus of claim 11, wherein an upper portion of each of the plurality of lift pins is formed of the non-silicon based material.

13. The apparatus of claim 11, wherein each of the plurality of lift pins is entirely formed of the non-silicon based material.

14. The apparatus of claim 9, wherein the support surface is part of a substrate transfer robot and the plurality of contact elements include contact pads disposed on an end effector of the substrate transfer robot.

15. A substrate processing system, comprising:
a substrate support disposed in a processing chamber, the substrate support having a substrate support surface and a plurality of lift pins arranged to support a substrate above the substrate support surface when lifted with respect to the substrate support; and
a substrate transfer robot including a support surface and a plurality of contact elements arranged to support the substrate when disposed on the substrate transfer robot,
wherein at least one of the substrate support surface, the plurality of contact elements, or the plurality of lift pins are formed of a non-silicon based material having a hardness less than or equal to a silicon hardness, having non-adhesiveness with silicon-based materials, having a coefficient of static friction that prevents sliding when contacting silicon-based materials, having a surface roughness less than or equal to 10 Ra, and that is electrically conductive such that particles generated from a substrate when contacting the at least one of the substrate support surface, the plurality of substrate contact elements, or the plurality of lift pins is reduced.

16. The substrate processing system of claim 15, wherein the non-silicon based material includes an electrically conductive plastic.

17. The substrate processing system of claim 15, wherein the non-silicon based material comprises one or more of aluminum oxide or stainless steel.

18. The substrate processing system of claim 15, wherein an upper portion of each of the plurality of lift pins is formed of the non-silicon based material.

19. The substrate processing system of claim 15, wherein each of the plurality of lift pins is entirely formed of the non-silicon based material.

20. The substrate processing system of claim 15, wherein the substrate support further includes a plurality of raised contact elements extending from the substrate support to support the substrate.

* * * * *